United States Patent
Owen et al.

(10) Patent No.: US 7,984,351 B2
(45) Date of Patent: Jul. 19, 2011

(54) DATA TRANSFER DEVICE AND METHOD THEREOF

(75) Inventors: Jonathan M. Owen, Northboro, MA (US); Michael J. Osborn, Hollis, NH (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 743 days.

(21) Appl. No.: 12/100,453

(22) Filed: Apr. 10, 2008

(65) Prior Publication Data

US 2009/0259874 A1    Oct. 15, 2009

(51) Int. Cl.
*G06F 11/00* (2006.01)
*G06F 1/00* (2006.01)
*G01R 31/28* (2006.01)

(52) U.S. Cl. ........... 714/731; 714/30; 714/744; 713/500

(58) Field of Classification Search ........................ None
See application file for complete search history.

(56) References Cited

U.S. PATENT DOCUMENTS

| | | | | |
|---|---|---|---|---|
| 7,174,473 | B2 * | 2/2007 | Musumeci et al. | 713/400 |
| 2001/0033629 | A1 * | 10/2001 | Ito | 375/368 |

OTHER PUBLICATIONS

Josef Schmid Joachim Knäblein, Advanced Ynchronous Scan Test Methodology for Multi Clock Domain ASIC, Aug. 6, 2002.*

* cited by examiner

*Primary Examiner* — Jeffrey A Gaffin
*Assistant Examiner* — Guerrier Merant

(57) ABSTRACT

A data transfer device transfers data between two clock domains of a data processing device when the data processing device is in a test mode. The data transfer device receives clock signals associated with each clock domain. To transfer data from a first clock domain to a second clock domain the data transfer device identifies transitions of clock signals associated with each clock domain that are sufficiently remote from each other so that data can deterministically be provided by one clock domain and sampled by the other. This ensures that data can be transferred between the clock domains deterministically even when the phase relationship between the clock signals is indeterminate.

20 Claims, 5 Drawing Sheets

DATA TRANSFER DEVICE AND METHOD THEREOF

FIELD OF THE DISCLOSURE

The present disclosure relates to transfer of information in a data processing device and more particularly to the transfer of information between different clock domains.

BACKGROUND

Data processing devices can employ multiple clock domains, with logic modules in each domain synchronized to a clock signal associated with that domain. Under normal operating conditions, the clock signals associated with different clock domains can be asynchronous with each other. However, testing a data processing device when clock domains operate asynchronously can be problematic, because if data is transferred between the clock domains during testing, the uncertainty in the timing of the transfer can cause the receiving clock domain to experience transitions at uncertain times, resulting in variable behavior. The variable behavior can be functionally correct, but still cause the data processing device to fail testing as the test outputs do not match a test program's expectations. Variability of device behavior can be reduced by applying a common test clock to all clock domains of the data processing device during testing. However, this may not accurately reflect the normal operating conditions of the data processing device, thereby reducing the accuracy of the test results. Therefore, a device and method for transferring data between clock domains of a device under test would be useful.

DETAILED DESCRIPTION

A data transfer device transfers data between two clock domains of a data processing device when the data processing device is in a test mode. The data transfer device receives clock signals associated with each clock domain. To transfer data from a first clock domain to a second clock domain the data transfer device identifies transitions of clock signals associated with each clock domain that are sufficiently remote from each other so that data can deterministically be provided by one clock domain and sampled by the other. This ensures that data can be transferred between the clock domains deterministically even when the phase relationship between the clock signals is indeterminate.

Figure 1:
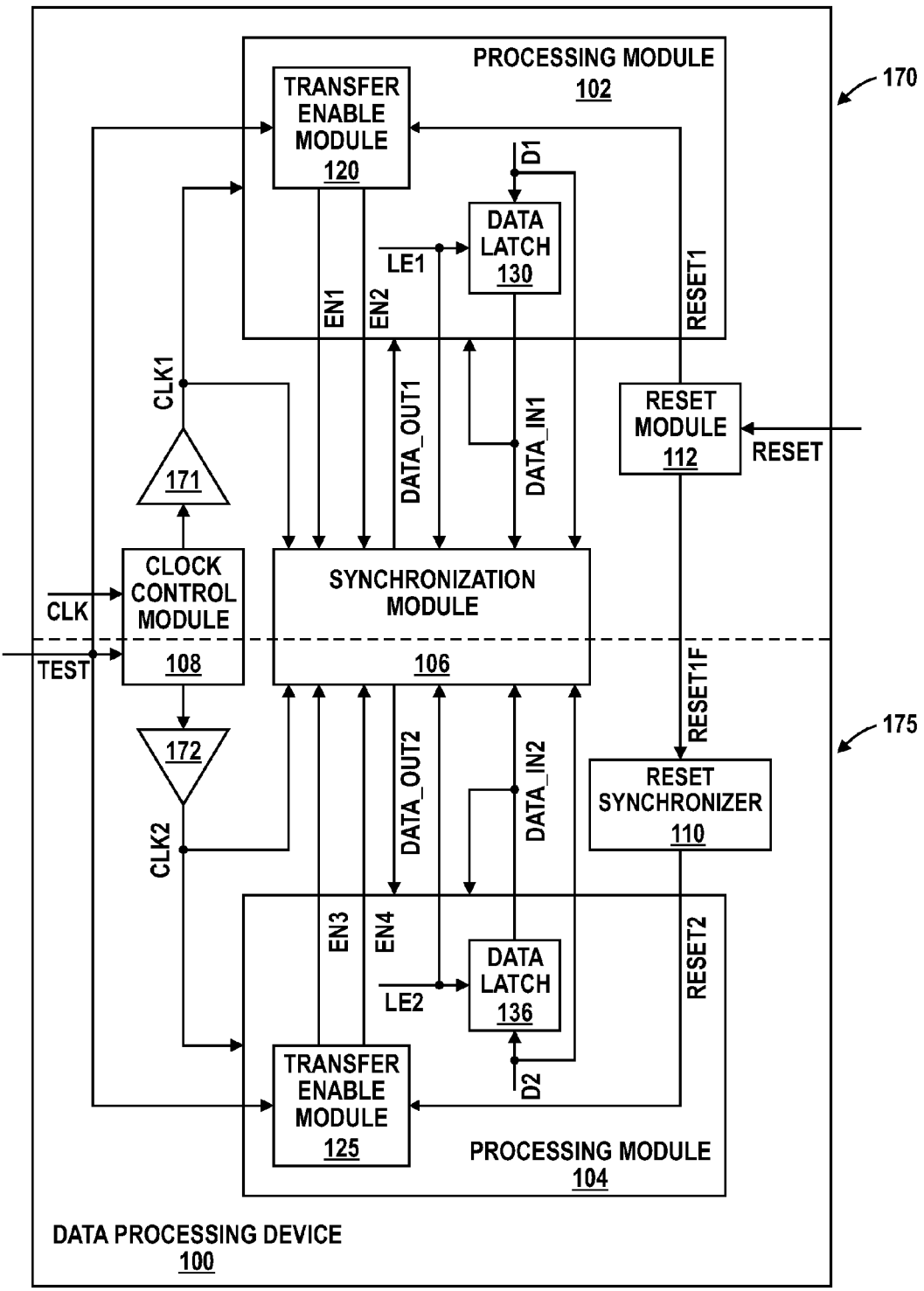
FIG. 1 is a block diagram of a particular embodiment of a data processing device in accordance with one aspect of the present disclosure.

Referring to FIG. 1, a block diagram of a particular embodiment of a data processing device 100 is illustrated. The data processing device 100 includes a processing module 102, a processing module 104, a synchronization module 106, a clock control module 108, a reset module 112, a reset synchronizer 110, and clock insertion delay elements 171 and 172.

The clock control module 108 includes an input to receive a clock signal labeled CLK, an input to receive a signal labeled TEST, a first output and a second output. The clock insertion delay element 171 includes an input connected to the first output of the clock control module 108 and an output to provide a clock signal labeled CLK1. The clock insertion delay element 172 includes an input connected to the second output of the clock control module 108 and an output to provide a signal labeled CLK2. The clock insertion delay elements 171 and 172 represent the delays to the clock signals provided by the clock control module 108 resulting from net delays, buffer delays, and the like. Further, the clock insertion delay elements 171 and 172 are not correlated. Accordingly, although the clock signals CLK1 and CLK2 are based on the CLK clock signal and therefore are synchronous signals, the phase and relationship between the clock signals can be indeterminate.

The reset module 112 includes an input to receive a signal labeled RESET, an output to provide a signal labeled RESET1, and an output to provide a signal labeled RESET1F. The reset synchronizer 110 includes an input to receive the signal RESET1F and an output to provide a signal labeled RESET2. The synchronization module 106 includes an input to receive the signal EN1, an input to receive the signal EN2, an input to receive the signal EN3, an input to receive the signal EN4, an input to receive the signal DATA_IN1, an input to receive the signal DATA_IN2, inputs to receive latch enable signals labeled LE1 and LE2, respectively, an output to provide the signal DATA_OUT1, and an output to provide the signal DATA_OUT2.

The processing module 102 includes a transfer enable module 120 and a data latch 130. The transfer enable module 120 includes an input to receive the TEST signal, an input to receive a signal labeled RESET1, an input to receive a signal labeled DATA_OUT1, an output to provide an enable signal labeled EN1, and an output to provide an enable signal labeled EN2. The data latch 130 includes an input to receive a signal labeled D1 from another element (not shown) of the processing module 102, an input to receive a latch enable signal labeled LE1, and an output to provide a signal labeled DATA_IN1 to provide data to the synchronization module 106. As illustrated, the DATA_IN1 signal can also be fed back to the processing module 102 to drive additional logic (not shown) of the module. The processing module 102 includes an input to receive the clock signal CLK1, which is provided to various devices of the processing module 102.

The processing module 104 includes a transfer enable module 125 and a data latch 136. The transfer enable module 125 includes an input to receive the TEST signal, an input to receive a signal labeled RESET2, an input to receive a signal labeled DATA_OUT2, an output to provide an enable signal labeled EN3, and an output to provide an enable signal labeled EN4. The data latch 136 includes an input to receive a signal labeled D2 from another element (not shown) of the processing module 104, an input to receive a latch enable signal labeled LE2, and an output to provide a signal labeled DATA_IN2 to provide data to the synchronization module 106. As illustrated, the DATA_IN2 signal can also be fed back to the processing module 104 to drive additional logic (not shown) of the module. The processing module 104 also includes an input to receive the clock signal CLK2, which is provided to various devices of the processing module 102.

The data processing device 100 can be a general purpose microprocessor, an application specific integrated circuit (ASIC), and the like, and includes logic modules, such as the modules 102 and 104, to manipulate input signals, representing input values, to produce specified output signals, representing output values. Each logic module of the data processing device 100 receives a respective clock signal to synchronize operations of the module. Logic modules synchronized to a common clock are referred to as being in a common clock domain. In the illustrated example of FIG. 1, the data processing device 100 includes a clock domain 170 associated with the clock signal CLK1 and a clock domain 175 associated with the clock signal CLK2. Therefore, the logic elements of the processing module 102 are synchronized with the clock signal CLK1, while the logic elements of the processing module 104 are synchronized with the clock signal CLK2. In addition, certain logic modules of the data processing device, such as the clock control module 108 can include some logic elements synchronized to one clock signal and other logic elements synchronized to another clock signal. These logic modules are illustrated as being in both clock domains 170 and 175, although it will be appreciated that in other embodiments these modules could be located exclusively in either clock domain.

In order to ensure that the data processing device 100 can operate according to specification, it can be placed in a test mode. In the test mode, the data processing device 100 is configured to perform tests to verify operations of different modules of the device. For example, in the test mode, the data processing device 100 can receive a series of test input signals at input pins (not shown) process those input signals by simulating normal operations, and provide a series of test output signals at output pins (not shown). These test output signals can be sampled external to the data processing device 100 and compared with expected values to verify the operations and performance of the data processing device 100.

The data processing device 100 determines that it has been placed in the test mode based on the state of the TEST signal and initiates the test in response to negation of the RESET signal. In one embodiment, the test process is controlled by an external tester (not shown) that provides the TEST, RESET and CLK signals to input pins (not shown) of the data processing device 100. In another embodiment, the data processing device 100 can execute a self-test operation by internally generating the TEST and RESET signals and applying these signals to external pins of the device. The self-test can be initiated by software executing at the data processing device, by assertion of a signal at an external pin (not shown) of the data processing device, and the like.

In the test mode of operation the clock signals CLK1 and CLK2 are generated by the clock generation module 108 based on the clock signal CLK. Accordingly, in the test mode of operation the clock signals CLK1 and CLK2 are synchronous signals. However, because of jitter and other perturbations, the phase relationship between the CLK1 and CLK2 clock signals can be indeterminate. Further, although the clock signals CLK1 and CLK2 may be at different frequencies, because they are generated from a common reference, the frequencies will be in an integer ratio.

The data processing device 100 transfers data on signals between processing modules 102 and 104. In the illustrated example of FIG. 1, data to be transferred from the processing module 102 to the clock domain 175 is latched at the data latch 130, and also into clock domain 170 portion of the synchronization module 106. The synchronization module 106 drives a clock domain 175 version out to the processing module 104. Similarly, data to be transferred from the logic module 104 is latched at the data latch 136, and also into the clock domain 175 portion of the synchronization module 106, and a clock domain 170 version is driven out to the processing module 102. The input, output, and clock enable of the data latches 130 and 132 are provided to the synchronization module 106 to allow it to latch the data internally in parallel with the external latches under certain circumstances, which reduces latency.

The synchronization module 106 effectuates data transfers between the logic modules 102 and 104 by latching the data to be transferred in the transferring clock domain and sampling the latched data in the receiving clock domain. The timing of the latching and sampling of data is based on the timing of the clock signal in the associated clock domain. For purposes of discussion, a clock period during which data is latched is referred to herein as a latching cycle and a clock period during which data is sampled is referred to herein as a sampling cycle. The synchronization module 106 determines which clock cycles of the clock signals CLK1 and CLK2 are latching or sampling cycles based on the signals EN1, EN2, EN3, and EN4. In the illustrated example of FIG. 1, the signals EN1 and EN2 determine the latching and sampling cycles, respectively, in the clock domain 170. Further, the signals EN3 and EN4 determine the latching and sampling cycles, respectively, in the clock domain 175. The transfer enable modules 120 and 125 control the signals EN1, EN2, EN3, and EN4, respectively, so that the latching and sampling cycles in each clock domain are sufficiently remote from each other so that data is deterministically transferred. Data is deterministically transferred if it is guaranteed not to be transitioning near the sample point, so that the sampling logic is guaranteed to always see the same value across multiple cycles, regardless of clock uncertainty.

In operation, when the data processing device 100 is in the test mode a test is initiated by negating the RESET signal. This indicates to the data processing device 100 that data can be transferred between the clock domains 170 and 175. However, because of the indeterminate relationship between the CLK1 and CLK2 clock signals, the RESET signal does not directly initiate data transfers in each clock domain. Instead, the data processing device 100 provides individual reset signals for each of the clock domains 170 and 175. In particular, the reset module 112 provides the signals RESET1 and RESET1F based on the RESET signal As illustrated, the reset module 112 is in the clock domain 170, and therefore the RESET1 and RESET1F signals are synchronized to the clock signal CLK1. The RESET1F signal is provided to the reset synchronizer 110, which synchronizes the signal to the clock signal CLK2, resulting in the signal RESET2.

The RESET1F signal is provided to the synchronizer 110, which consists of a series of flops (not shown) clocked by the clock signal CLK2. The output of the last flop in the series is RESET2, which is therefore synchronous to CLK2. The number of flops is chosen to be sufficient to render the chance of RESET2 going metastable close to 0. Since CLK2 has an unknown phase relationship to CLK1, the first flop in the series may sample the deassertion of RESET1F immediately after it deasserts, or up to one CLK2 cycle later. Every subsequent flop in the chain adds one CLK2 cycle to the latency of the synchronizer. The total latency of the synchronizer is thus between N−1 and N CLK2 periods (depending on the phase relationship of CLK1 and CLK2), where N is the number of flops in the synchronizer. In the illustrated embodiment, N=3.

The timing of the latching and sampling cycles at the synchronization module 106 depends on the timing of the RESET1 and RESET2 signals. However, because the RESET1 and RESET2 signals are synchronized to the clock signals CLK1 and CLK2, respectively, their phase relationship is indeterminate. Therefore the timing relationship between a latching cycle in one clock domain and a sampling cycle in the other clock domain is also indeterminate. This may be better understood with reference to FIG. 2.

Figure 2:
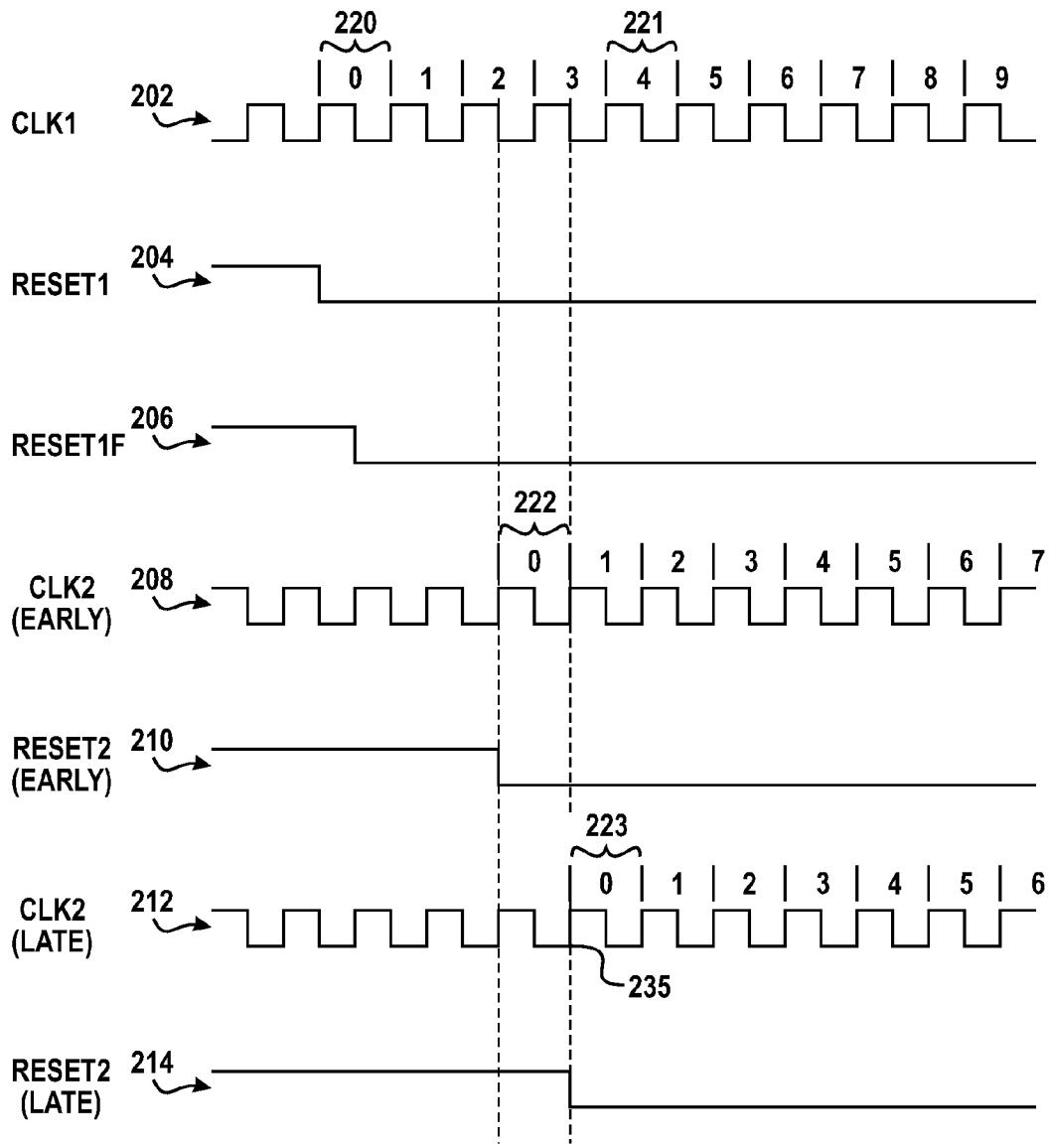
FIG. 2 is a diagram of a particular embodiment of signal waveforms of the data processing device of FIG. 1.
Figure 3:
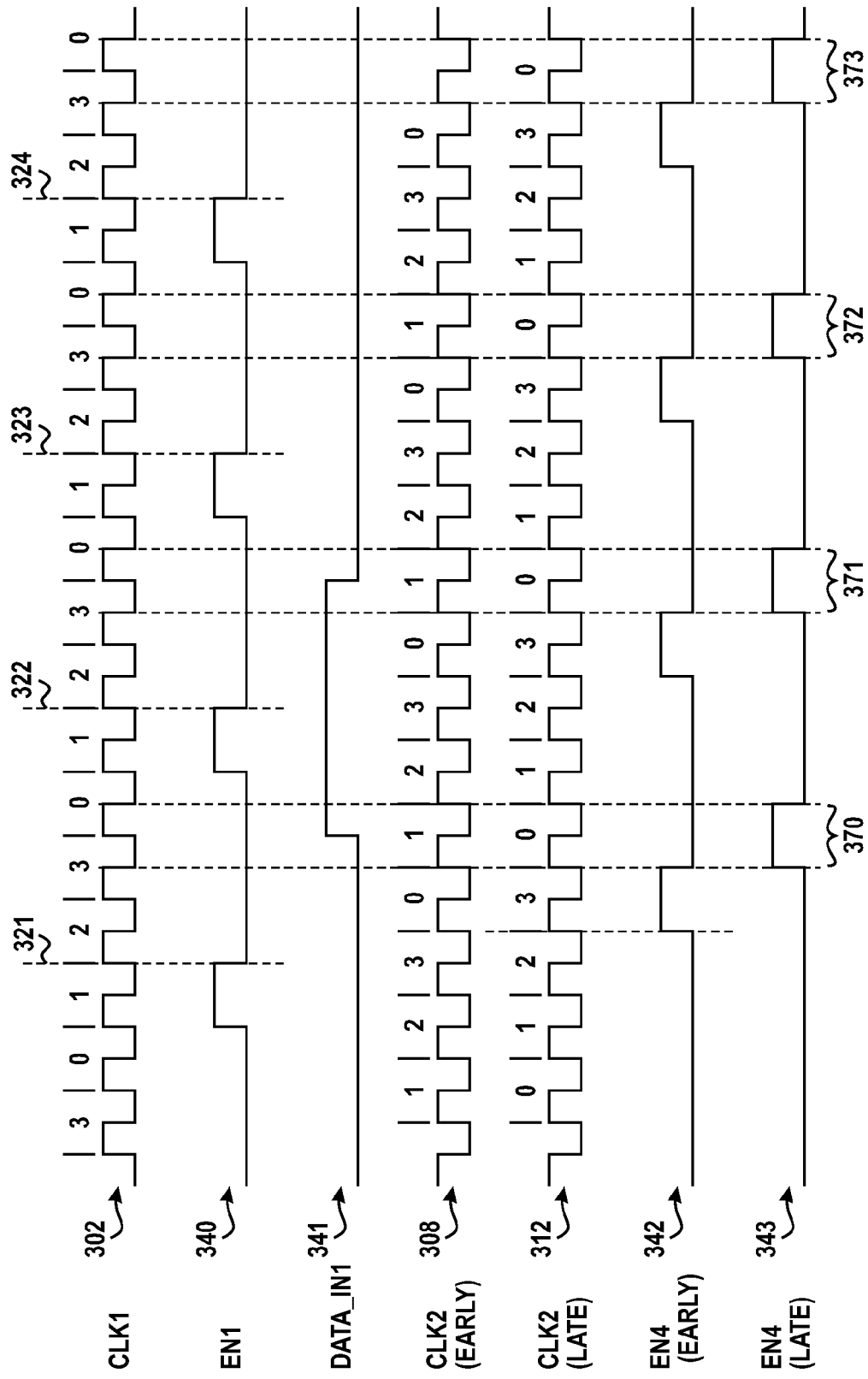
FIG. 3 is a diagram of a particular embodiment of signal waveforms of the data processing device of FIG. 1.

FIG. 2 illustrates a particular embodiment of signal waveforms for the data processing device 100. In particular, FIG. 2 illustrates waveform 202, representing the clock signal CLK1, waveform 204, representing the signal RESET1, and waveform 206, representing the signal RESET1F. FIG. 2 also illustrates waveforms 208, 210, 212, and 214. These signals represent the possible timing of the signals RESET2 and CLK2. Waveform 210 shows the earliest that RESET2 could deassert, based on a CLK2 edge occurring immediately after the falling CLK1 edge in CLK1's cycle 0 that caused the deassertion of RESET1F. This corresponds to a synchronizer latency of N−1 cycles. Waveform 214 shows the latest that RESET2 could deassert, based on a CLK2 edge occurring immediately before the falling CLK1 edge in CLK1's cycle 0, which means that RESET1Fs deassertion wasn't sampled until the following CLK2 edge. This corresponds to a synchronizer latency of N cycles FIG. 3 illustrates a particular embodiment of signal waveforms for the data processing device 100, including waveforms 302, 304, 308, 310, 312, and 314, which correspond to the waveforms 202, 204, 208, 210, 212, and 214 of FIG. 2. FIG. 3 also illustrates waveform 340, representing the signal EN1, waveform 341, representing the waveform DATA_IN1, and waveforms 342 and 343, representing possible waveforms for the signal EN4.

In the illustrated embodiment of FIG. 3, hardware counters at transfer enable modules 120 and 125 keep track of the cycle numbers since reset in the associated clock domain. The counters are relatively small, so they roll over and repeat regularly; they only need to count high enough to define a window large enough that latch and sample points may be placed within it sufficiently far apart to guarantee deterministic sampling given clock uncertainty. In the event of CLK1 and CLK2 being different frequencies, the counters will be counting to different numbers before repeating, but will still be repeating over the same period of time. This is always possible because CLK1 and CLK2's frequencies are in an integer ratio.

The enable signals EN1 and EN4 for latching and sampling, respectively are generated by decoding the counter values, such that latching/sampling occur in the same clock cycle in each repeating window. Data is latched or sampled at the end of the cycle in which the corresponding enable is asserted. In the illustrated example of FIG. 2 the latch point in the CLK1 domain is at the end of cycle 1 (so EN1 is asserted in cycle 1) and the frequencies of the CLK1 and CLK2 signals are the same. Then, cycle 0 in the sampling clock domain is always N−1 to N clocks later, with some additional dynamic clock uncertainty due to jitter and duty cycle variation.

In order to sample deterministically, the sample point in the CLK2 domain should not occur near the latch point. As seen in the CLK2 domain, the latch point occurs nominally between the middle of cycle 3 (if CLK2 is at its earliest extreme) and the middle of cycle 2 (if CLK2 is at its latest extreme) in the CLK2 domain. So, this is the unsafe time to sample. We generate EN4 in cycle 0 of the CLK2 domain, so that we're sampling between the middle of cycle 3 and the middle of cycle 0 in the CLK1 domain. Thus, the sampling window is illustrated by time periods 370, 371, 372, and 373 in FIG. 3, and has a 1.5 cycles margin in both the setup and hold directions with the latching times in the CLK1 domain, illustrated in FIG. 2 as times 321, 322, 323, and 324. Accordingly, sampling occurs in the CLK2 clock domain sufficiently remote in time from latching in the CLK1 domain to accommodate 1.5 clock cycles of clock uncertainty due to jitter and duty cycle variation, as well as the setup and hold requirements of the sampling flops.

In the opposite direction, from CLK2 to CLK1, we again assume that we will latch data at the end of cycle 1, this time in the CLK2 domain. So, EN3 is asserted in cycle 1. This nominally falls between the middle of cycle 0 and the middle of cycle 1 in the CLK1 domain. Asserting EN2 in cycle 2 means that data will be sampled at the end of cycle 2, which again provides 1.5 cycles of margin in each direction to cover clock uncertainty, and setup and hold requirements of the destination flops.

If the clock uncertainty and setup and hold requirements added up to more than 1.5 cycles, more margin could be provided by extending the size of the repeating window (having the counters repeat on a larger cycle) to allow more space to locate the latch and sample points further apart. In another embodiment, CLK1 and CLK2 are at different frequencies, and therefore there are a different numbers of cycles in the repeating window in each domain, but it latch and sample points can still be selected such that transfer between the clock domains is reliable.

Figure 4:
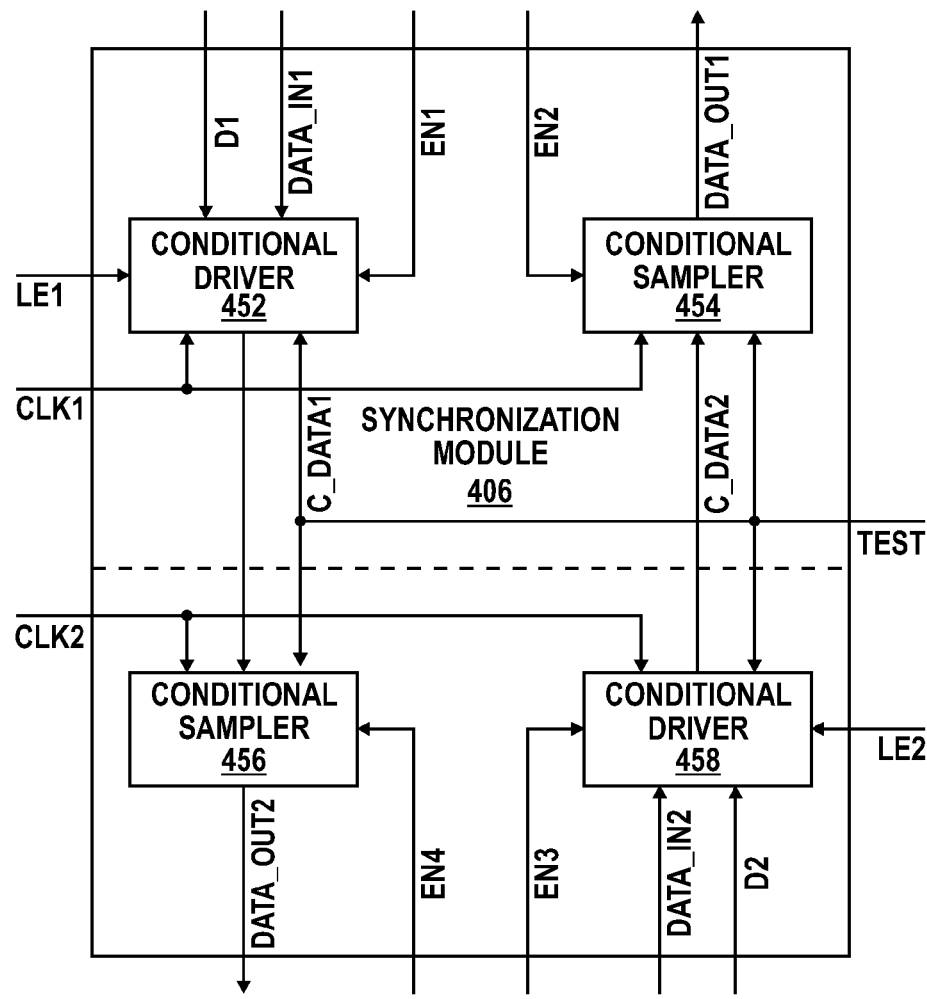
FIG. 4 is a block diagram of a particular embodiment of a synchronization module of FIG. 1.

Referring to FIG. 4, a block diagram of a particular embodiment of a synchronization module 406, corresponding to the synchronization module 106 of FIG. 1. The synchronization module 406 includes a conditional driver 452, a conditional driver 458, a conditional sampler 454, and a conditional sampler 456. The conditional driver 452 includes an input to receive the signal CLK1, an input to receive the signal D1, an input to receive the signal DATA_IN1, an input to receive the signal EN1, an input to receive the signal TEST, an input to receive the signal LE1, and an output to provide a signal C_DATA1. The conditional sampler 454 includes an input to receive the clock signal CLK1, an input to receive the signal EN2, an input to receive a signal C_DATA2, an input to receive the signal TEST, and an output to provide the signal DATA_OUT1.

The conditional sampler 456 includes an input to receive the clock signal CLK2, an input to receive the signal EN3, an input to receive the signal C_DATA1, an input to receive the signal TEST, and an output to provide the signal DATA_OUT1. The conditional driver 458 includes an input to receive the signal CLK1, an input to receive the signal D2, an input to receive the signal DATA_IN2, an input to receive the signal EN4, an input to receive the signal LE2, an input to receive the signal TEST, and an output to provide the signal C_DATA2.

In operation, when the TEST signal indicates that the data processing device 100 is in a test mode, the conditional driver 452 selectively latches the data provided by one of the DATA_IN1 and D1 signals via the C_DATA1 signal in response to assertion of the EN1 signal. The conditional sampler 456 samples the latched data provided via the C_DATA1 signal in response to the EN3 signal and provides the sampled data via the DATA_OUT2 signal. The EN1 and EN4 signals correspond to the EN1 and EN4 signals illustrated in FIG. 3. Accordingly, assertion of the signals EN1 and EN4 is timed so that the data latched at the conditional driver 452 is stable before it is sampled by the conditional sampler 456, thus enhancing the reliability of the transfer.

In addition, when the TEST signal indicates that the data processing device 100 is in a test mode, the conditional driver 452 selectively provides the data represented by one of the DATA_IN2 and D2 signals via the C_DATA2 signal in response to assertion of the EN4 signal. The conditional sampler 454 samples the data provided via the C_DATA1 signal in response assertion of the EN2 signal and provides the sampled data via the DATA_OUT1 signal. The EN2 and EN3 signals are similar to the EN1 and EN4 signals, respectively, as described with respect to FIG. 3. Accordingly, the signals EN2 and EN3 is timed so that the data provided by the conditional driver 458 is stable before it is sampled by the conditional sampler 454.

Figure 5:
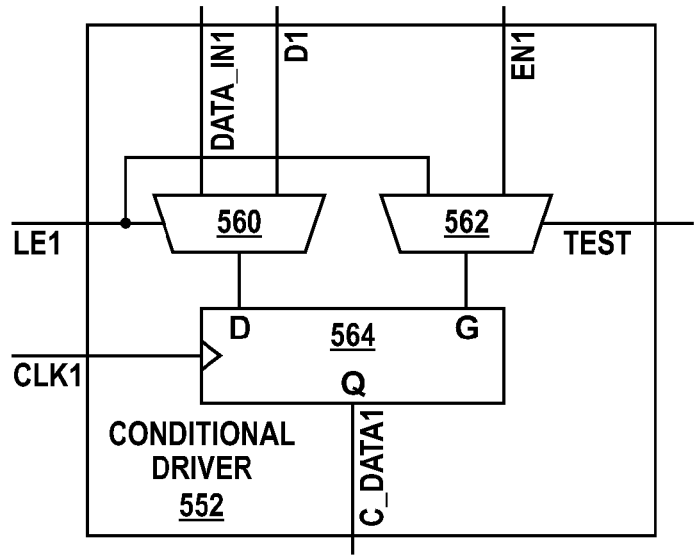
FIG. 5 is a block diagram of a particular embodiment of a conditional driver of FIG. 4.

Referring to FIG. 5, a block diagram of a particular embodiment of a conditional driver 552, corresponding to the conditional driver 452 of FIG. 4, is illustrated. The conditional driver 552 includes a multiplexer 560, a multiplexer 562, and a latch 564. The multiplexer 560 includes an input to receive the signal DATA_IN1, an input to receive the signal D1, a control input to receive the signal LE1, and an output. The multiplexer 562 includes an input to receive the clock signal LE1, an input to receive the signal EN1, a control input to receive the signal TEST, and an output. The latch 564 includes an input labeled "D" connected to the output of the multiplexer 560, an input labeled "G" connected to the output of the multiplexer 564, and an output labeled "Q" to provide the signal C_DATA.

Figure 6:
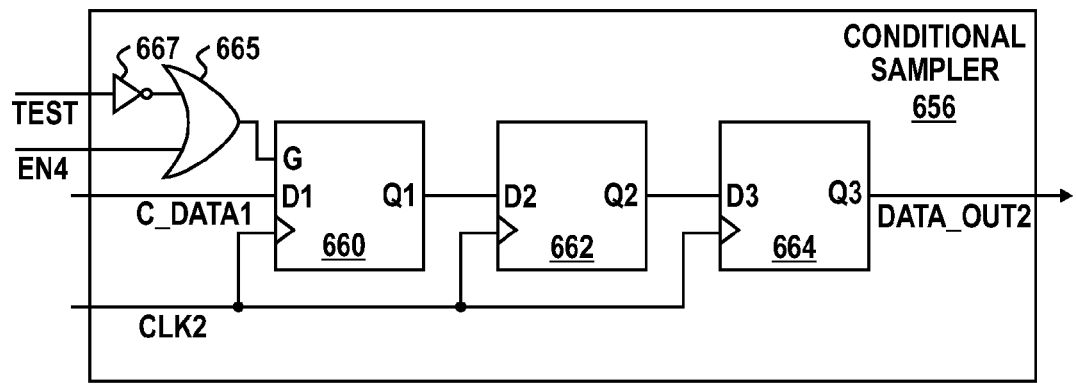
FIG. 6 is a block diagram of a particular embodiment of a conditional sampler of FIG. 4.

In operation, when the TEST signal is asserted, the multiplexer 562 applies the EN1 signal to the G input, and the multiplexer 560 provides either the contents of data latch 130 (DATA_IN1), or the data currently being latched (D1) if the latch enable signal is asserted indicating that the latch 130 is currently loading. If the TEST signal is not asserted, the data latch loads whenever the latch enable is asserted; when the latch enable is asserted, the multiplexer 560 will always be selecting D1, so the latch 564 will duplicate the behavior of data latch 130. Thus, the operations of the latch 564 and the latch 130 only differ in test mode Referring to FIG. 6, a block diagram of a particular embodiment of a conditional sampler 656, corresponding to the conditional sampler 456 of FIG. 4, is illustrated. The conditional sampler 656 includes a latch 660, a latch 662, a latch 664, an OR gate 665, and an inverter 667. The inverter 667 includes an input to receive the signal TEST and an output. The OR gate 665 includes an input to receive the signal EN4, an input connected to the output of the inverter 667 and an output. The latch 660 includes an input labeled "G" connected to the output of the OR gate 665, an input labeled "D1" to receive the signal C_DATA1, a clock input to receive the signal CLK2, and an output labeled "Q1." The latch 662 includes an input labeled "D2" connected to the output of the latch 660, a clock input to receive the signal CLK2, and an output labeled "Q2." The latch 664 includes an input labeled "D3" connected to the output of the latch 662, a clock input to receive the signal CLK2, and an output labeled "Q3" to provide the signal DATA_OUT2.

In operation, the latch 660 provides data at the D1 input in response to assertion of a signal at the G input and at the clock input. Accordingly, when the TEST signal is asserted, the output of the OR gate 665, and therefore the signal at the G input, is determined by the signal EN4. When the data processing device 100 is not in test mode (i.e. the TEST signal is negated), the signal at the G input remains in the asserted state, so that the operation of the latch 660 is controlled by the clock signal CLK2. In the test mode of operation, when the EN4 signal is asserted, and in response to a rising edge of the clock signal CLK2, the latch 660 samples the data provided via the C_DATA1 input and drives the data via the Q1 output. The latches 662 and 664 synchronize the latched data so that it is provided via the DATA_OUT2 signal synchronous with the clock signal CLK2. The latches 662 and 664 do not include G inputs, so that their operation is controlled by edges of the clock signal CLK2. In addition, although in the illustrated embodiment of FIG. 6 the conditional sampler 656 includes 3 flip-flops, a different number of flops could be employed, depending on metastability requirements of the synchronization module 106.

Figure 7:
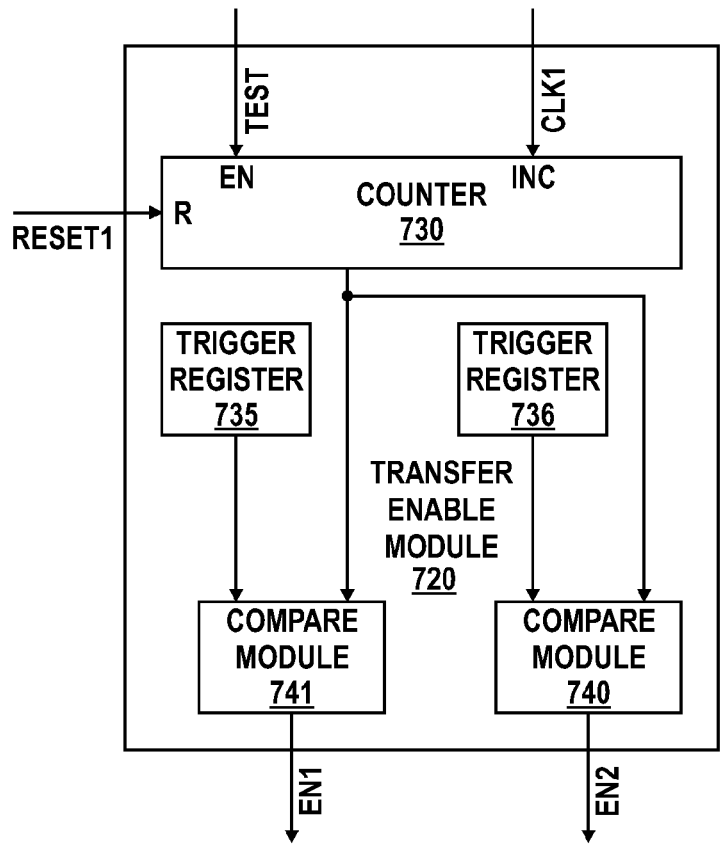
FIG. 7 is a block diagram of a particular embodiment of a transfer enable module of FIG. 1.

Referring to FIG. 7, a block diagram of a particular embodiment of a transfer enable module 720, corresponding to the transfer enable module 120 of FIG. 1, is illustrated. The transfer enable module 720 includes a counter 730, a trigger register 735, a trigger register 736, a compare module 740, and a compare module 741. The counter 730 includes an input labeled "EN" to receive the signal TEST, an input labeled "INC" to receive the clock signal CLK1, an input labeled "R" to receive the RESET1 signal, and an output. The trigger register 735 and the trigger register 736 each include an output. The compare module 740 includes an input connected to the output of the counter 730, an input connected to the output of the threshold register 736, and an output to provide the signal EN2. The compare module 741 includes an input connected to the output of the trigger register 735, an input connected to the output of the counter 730, and an output to provide the enable signal EN1.

In operation, the counter 730 is a programmable modulo free-running counter that is configured to increment a stored value based on a signal received at the INC input when a signal at the EN input indicates the counter should be enabled. Accordingly, when the TEST signal indicates the data processing device 100 is in a test mode, the counter 730 is configured to increment its stored value based on rising edges of the clock signal CLK1. When the counter 730 receives a rising edge of the clock signal CLK1 when the value stored is the maximum value that can be stored, the counter 730 returns to it's initial value. Accordingly, the counter 730 generates a repeating pattern from its initial value to its maximum value. In addition, the counter 730 is configured to reset its stored value to an initial value based on a signal at the R input, so that the signal RESET1 controls resetting of the counter 730.

The trigger register 735 is configured to store a threshold value representing the number of clock edges of the clock signal CLK1 that should trigger assertion of the signal EN1, while the trigger register 736 is configured to store a threshold value to trigger assertion of the clock signal CLK2. The compare module 741 is configured to compare the trigger value stored in the trigger register 735 with the value stored in the counter 730, and to assert the signal EN1 when the threshold value is matched. Similarly, the compare module 740 is configured to compare the trigger value stored in the trigger register 736 with the value stored in the counter 730, and to assert the signal EN2 when the threshold value is matched.

The operation of the transfer enable module 720 may be better understood with reference to FIG. 3. To provide the enable signal EN1 illustrated by signal 304 of FIG. 3, the counter 730 is configured to be a 2-bit counter that returns to an initial value after it has recorded 4 rising edges of the clock signal CLK1. The threshold value stored in the threshold register 735 is set to the number two while the programmable modulo value is set to the number four. Accordingly, the compare module 740 asserts the EN1 signal in response to the second rising edge of the clock signal CLK1, and every 4 rising edges thereafter.

Different values can be stored in the trigger registers 735 and 736 to independently control the timing of the EN1 and EN2 signals. Further, in another embodiment the trigger values are not stored in registers. Instead, the compare modules 740 and 741 compare the value stored in the counter 730 with hard-wired trigger values.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A method, comprising:
   identifying a first edge of a first clock signal in response to receiving a first reset signal;
   identifying a first edge of a second clock signal in response to receiving a second reset signal, the second reset signal based on the first reset signal;
   determining a first number of clock edges of the first clock signal after the first edge;
   latching data from a first synchronous logic module in response to the first number of clock edges matching a first threshold, the first synchronous logic module synchronized to the first clock signal;
   determining a second number of clock edges of the second clock signal after the first edge; and
   sampling the latched data from the first synchronous logic module at a second synchronous logic module in response to the second number of clock edges matching a second threshold, the second synchronous logic module synchronized to the second clock signal.

2. The method of claim 1, wherein determining the first number of clock edges comprises:
   adjusting data stored at a first counter in response to clock edges of the first clock signal; and
   determining the first number of clock edges of based on the data stored at the first counter.

3. The method of claim 2, wherein latching data from the first synchronous logic module comprises:
   asserting an enable signal in response to the data stored at the first counter matching the first threshold; and
   latching data from the first synchronous logic module in response to assertion of the enable signal.

4. The method of claim 2, wherein determining the second number of clock edges comprises:
   adjusting data stored at a second counter in response to clock edges of the second clock signal; and
   determining the second number of clock edges based on the data stored at the second counter.

5. The method of claim 2, further comprising resetting the data at the first counter in response to the number of clock edges of the first clock signal after the first edge matching a third threshold.

6. The method of claim 1, further comprising:
   latching data from the second synchronous logic module in response to the second number of clock edges matching the second threshold; and
   sampling the latched data from the second synchronous logic module at the first synchronous logic module in response to the first number of clock edges matching the first threshold.

7. The method of claim 1, wherein identifying a first edge of the first clock signal comprises identifying the first edge in response to determining an integrated circuit is in a test mode.

8. The method of claim 1, wherein the second clock signal is out of phase with the first clock signal.

9. The method of claim 1, wherein the phase relationship between the first clock signal and the second clock signal is indeterminate.

10. A device, comprising:
    a first transfer enable module comprising:
      a first counter comprising a first input configured to receive a first clock signal and a second input configured to receive a first reset signal, the first counter configured to reset a stored value in response to the first reset signal and to adjust the stored value in response to the first clock signal; and
      a first output configured to assert a first enable signal in response to the stored value of the first counter matching a first threshold;
    a first driver module comprising a first input configured to receive data from a first synchronous logic module, a second input coupled to the first output of the first transfer enable module, and an output configured to provide data received at the input in response to assertion of the first enable signal, the first synchronous logic module synchronized to the first clock signal;
    a second transfer enable module comprising:
      a second counter comprising a first input configured to receive a second clock signal and a second input configured to receive a second reset signal based on the first reset signal, the second counter configured to reset a stored value in response to the second reset signal and to adjust the stored value in response to the second clock signal; and
      a first output configured to assert a second enable signal in response to the stored value of the second counter being in a second relationship with a second threshold; and
    a first sampling module comprising a first input configured to receive data from the first driver module, a second input coupled to the first output of the second transfer enable module, and an output coupled to a second synchronous logic module, the output configured to provide data received at the input in response to assertion of the second enable signal, the second synchronous logic module synchronized to the second clock signal.

11. The device of claim 10, wherein the first transfer enable module further comprises a second output configured to assert a third enable signal in response to the stored value of the first counter matching the first threshold.

12. The device of claim 11, wherein the second transfer enable module further comprises a second output configured to assert a fourth enable signal in response to the stored value of the second counter matching the second threshold.

13. The device of claim 12, further comprising:
    a second driver module comprising an input configured to receive data from the second synchronous logic module, an input coupled to the second output of the second transfer enable module, and an output configured to provide data received at the input in response to assertion of the third enable signal; and
    a second sampling module comprising an input configured to receive data from the second driver module, an input coupled to the second output of the first transfer enable module, and an output coupled to the first synchronous logic module, the output configured to provide data received at the input in response to assertion of the fourth enable signal.

14. The device of claim 10, wherein the first driver module further comprises a third input configured to receive a test enable signal indicative of when an integrated circuit is in a test mode.

15. The device of claim 14, wherein the first driver module further comprises:
- a fourth input coupled to an output of the first synchronous logic module;
- a fifth input configured to receive the first clock signal;
- a sixth input configured to receive a latch enable signal;
- a first multiplexer comprising a first input coupled to the first input of the first driver module, a second input coupled to the fourth input of the first driver module, a control input coupled to the sixth input of the first driver module, and an output configured to selectively provide data at the first input or the second input of the first multiplexer based on a signal received at the control input;
- a second multiplexer comprising a first input coupled to the sixth input of the first driver module, a second input coupled to the second input of the first driver module, a control input coupled to the third input of the first driver module, and an output configured selectively provide data at the first input or the second input of the second multiplexer based on a signal received at the control input; and
- a latch comprising a first input coupled to the output of the first multiplexer, a second input coupled to the output of the second multiplexer, a clock input coupled to the fourth input of the first driver module, and an output coupled to the output of the first driver module, the output configured to selectively provide data at the first input based on a signal received at the second input.

16. The device of claim 10, wherein the first sampling module comprises:
- a third input configured to receive the second clock signal;
- a fourth input configured to receive a test enable signal indicative of when an integrated circuit is in a test mode;
- an inverter comprising an input coupled to the fourth input of the first sampling module and an output;
- an OR gate comprising an input coupled to the output of the inverter, an input coupled to the second input of the first sampling module, and an output;
- a first latch comprising a first input coupled to the first input of the first sampling module, a second input coupled to the output of the OR gate, a third input coupled to the third input of the first sampling module, and an output configured to provide data at the first input based on a signal received at the second input and on a signal received at the third input.

17. The device of claim 16, wherein the first sampling module further comprises:
- a second latch comprising a first input coupled to the output of the first latch a second input configured to receive the first clock signal, and an output configured to provide data at the first input based on a signal received at the second input; and
- a third latch comprising a first input coupled to the output of the second latch a second input configured to receive the first clock signal, and an output coupled to the output of the first sampling module, the output configured to provide data at the first input based on a signal received at the second input.

18. The device of claim 10, wherein when an integrated circuit is in a test mode of operation, the first clock signal and the second clock are synchronous and out of phase.

19. The device of claim 18, wherein when the integrated circuit is in a normal mode of operation, the first clock signal and the second clock signal are asynchronous.

20. The device of claim 10, wherein a phase relationship between the first and the second clock signals is indeterminate.

* * * * *